United States Patent
Park et al.

(10) Patent No.: US 7,948,168 B2
(45) Date of Patent: May 24, 2011

(54) ORGANIC LIGHT EMITTING DISPLAY AND METHOD OF MANUFACTURING THE SAME

(75) Inventors: Jong-Hyun Park, Yongin-si (KR); Chun-Gi You, Hwaseong-si (KR); Sun Park, Hwaseong-si (KR); Soo-Hyun Kim, Cheonan-si (KR); Yul-Kyu Lee, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 14 days.

(21) Appl. No.: 12/406,197

(22) Filed: Mar. 18, 2009

(65) Prior Publication Data

US 2010/0066240 A1    Mar. 18, 2010

(30) Foreign Application Priority Data

Sep. 18, 2008 (KR) .................. 10-2008-0091715

(51) Int. Cl.
*H01J 1/62* (2006.01)
*H01J 63/04* (2006.01)
*H01L 51/00* (2006.01)

(52) U.S. Cl. ........ 313/504; 313/498; 313/506; 313/512; 313/292

(58) Field of Classification Search .......... 313/498–512, 313/292, 609
See application file for complete search history.

(56) References Cited

U.S. PATENT DOCUMENTS

| | | | |
|---|---|---|---|
| 2005/0170076 A1* | 8/2005 | Seki et al. ................ | 427/66 |
| 2005/0200273 A1* | 9/2005 | Nozawa .................. | 313/503 |
| 2005/0258745 A1* | 11/2005 | Tsujimura et al. ....... | 313/506 |
| 2005/0285509 A1* | 12/2005 | Funamoto et al. ...... | 313/504 |
| 2006/0022587 A1* | 2/2006 | Jeong et al. ............. | 313/504 |
| 2006/0197441 A1* | 9/2006 | Tsai et al. ............... | 313/506 |
| 2006/0273715 A1* | 12/2006 | Yang et al. .............. | 313/504 |
| 2007/0063645 A1* | 3/2007 | Yokoyama ............... | 313/506 |
| 2008/0238295 A1* | 10/2008 | Takei et al. .............. | 313/499 |
| 2009/0058283 A1* | 3/2009 | Tanaka et al. ........... | 313/504 |
| 2009/0174320 A1* | 7/2009 | Kim ........................ | 313/504 |
| 2009/0261712 A1* | 10/2009 | Choi et al. .............. | 313/504 |

* cited by examiner

*Primary Examiner* — Karabi Guharay
*Assistant Examiner* — Kevin Quarterman
(74) *Attorney, Agent, or Firm* — F. Chau & Associates, LLC

(57) ABSTRACT

An organic light emitting display includes a first substrate having a plurality of pixel areas, a driving transistor disposed on the first substrate, an organic layer disposed on the driving transistor, a first electrode disposed on the organic layer and electrically connected to the driving transistor, an insulating layer pattern disposed on the organic layer, the insulating layer pattern having a first opening corresponding to each pixel area, a bank pattern disposed on the insulating layer pattern, the bank pattern having a second opening corresponding to the first opening, an organic light emitting layer disposed in the first and second openings, and a second electrode disposed on the organic light emitting layer.

7 Claims, 12 Drawing Sheets

ORGANIC LIGHT EMITTING DISPLAY AND METHOD OF MANUFACTURING THE SAME

CROSS-REFERENCE TO RELATED APPLICATION

This application claims priority to Korean Patent Application No. 2008-91715 filed on Sep. 18, 2008, the contents of which are herein incorporated by reference in their entirety.

BACKGROUND OF THE INVENTION

1. Technical Field

The present disclosure relates to an organic light emitting display and a method of manufacturing the same, and more particularly, to an organic light emitting display having an insulating layer pattern and a method of manufacturing the same.

2. Discussion of the Related Art

An organic light emitting display (OLED) does not require a backlight. Thus, the OLED draws less power, and is lighter and thinner than, for example, an LCD device. The OLED has a wide viewing angle, and a faster response time than, for example, an LCD.

The OLED includes a top electrode, a bottom electrode and an organic light emitting layer interposed between the top and bottom electrodes to generate light. The OLED displays images using light generated from the organic light emitting layer.

When the organic light emitting layer chemically reacts with moisture or gas, a function of the organic light emitting layer such as a light emission function is deteriorated. Thus, there is a need for a pixel structure in the OLED that can prevent an infiltration of moisture or gas into the organic light emitting layer.

SUMMARY OF THE INVENTION

According to an exemplary embodiment of the present invention, an organic light emitting display comprises a first substrate having a plurality of pixel areas, a driving transistor disposed on the first substrate, an organic layer disposed on the driving transistor, a first electrode disposed on the organic layer and electrically connected to the driving transistor, an insulating layer pattern disposed on the organic layer, the insulating layer pattern having a first opening corresponding to each pixel area, a bank pattern disposed on the insulating layer pattern, the bank pattern having a second opening corresponding to the first opening, an organic light emitting layer disposed in the first and second openings, and a second electrode disposed on the organic light emitting layer.

The first substrate may comprise a bonding area surrounding the pixel areas.

The organic light emitting display may further comprise a third opening formed through the bank pattern corresponding to the bonding area.

The organic light emitting display may further comprise a second substrate facing the first substrate, and a bonding member disposed between the first substrate and the second substrate to couple the first substrate to the second substrate.

The bonding member may contact the insulating layer pattern in the bonding area through the third opening.

The insulating layer pattern may comprise silicon nitride.

The bank pattern may comprise a photoresist material.

The organic layer can be removed from the bonding area.

The insulating layer pattern may prevent gas or moisture generated from the organic layer from penetrating into the organic light emitting layer.

According to an exemplary embodiment of the present invention, a method of forming an organic light emitting display comprises forming a first substrate having a plurality of pixel areas, forming a driving transistor on the first substrate, forming an organic layer on the driving transistor, forming a first electrode on the organic layer at each pixel area, depositing an insulating material on the first electrode, depositing a bank material on the insulating material, etching the insulating material and the bank material to form a first opening and a second opening, respectively, forming an organic light emitting layer in the first opening and the second opening, and forming a second electrode on the organic light emitting layer.

Forming the first and second openings may comprise etching the bank material corresponding to the pixel areas, and etching the insulating material corresponding to the pixel areas using the bank material as a mask.

The method may further comprise forming a bonding member between the first substrate and a second substrate corresponding to a bonding area surrounding the pixel areas to couple the first substrate to the second substrate.

Etching the bank material may comprise partially removing the bank material such that the bank material corresponding to a boundary of the pixel areas remains in a first thickness and the bank material corresponding to the bonding area remains in a second thickness smaller than the first thickness, and completely removing the bank material corresponding the pixel areas.

The method may further comprise removing the bank material remaining in the boundary of the pixel areas by a thickness difference between the first thickness and the second thickness, and removing the bank material remaining in the bonding area by the thickness difference between the first thickness and the second thickness such that the bank material is completely removed from the bonding area to form a third opening.

The bonding member may contact the insulating material in the bonding area through the third opening.

The insulating material may comprise silicon nitride.

The bank material may comprise a photoresist material.

The bank material can be developed using a slit mask or a half tone mask such that the bank material remains in the first thickness and the second thickness.

The method may further comprise removing the organic layer from the bonding area to form an organic layer pattern.

The insulating material may prevent gas or moisture generated from the organic layer from penetrating into the organic light emitting layer.

BRIEF DESCRIPTION OF THE DRAWINGS

Exemplary embodiments of the present disclosure can be understood in more detail from the following description taken in conjunction with the accompanying drawings of which.

DESCRIPTION OF EXEMPLARY EMBODIMENTS

Exemplary embodiments of the present invention will be described in more detail with reference to the accompanying drawings. The present invention may, however, be embodied in many different forms and should not be construed as limited to the embodiments set forth herein.

Figure 1:
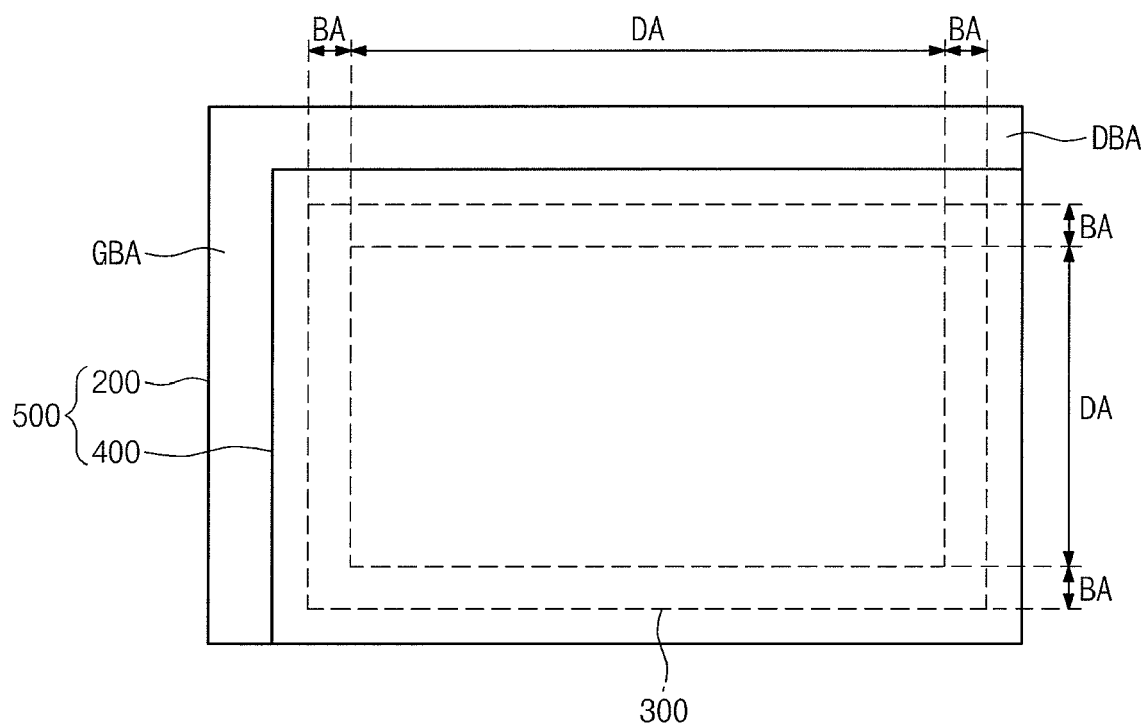
FIG. 1 is a plan view showing an organic light emitting display according to an exemplary embodiment of the present invention.

FIG. 1 is a plan view showing an organic light emitting display according to an exemplary embodiment of the present invention.

Figure 2:
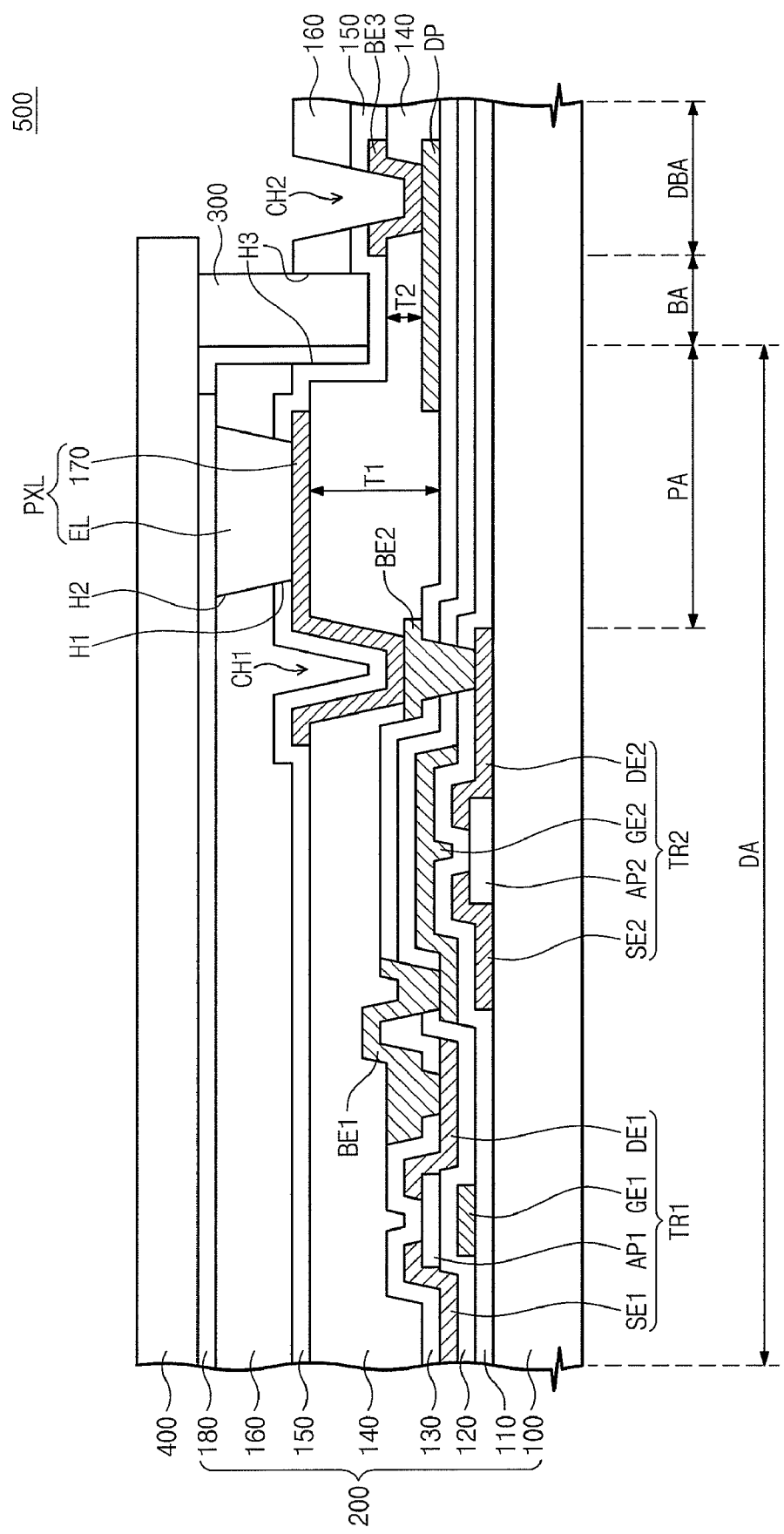
FIG. 2 is a sectional view showing a part of an organic light emitting display according to an exemplary embodiment of the present invention.

Referring to FIGS. 1 and 2, an organic light emitting display 500 includes a first substrate 200, a second substrate 400 facing the first substrate 200, and a bonding member 300 interposed between the first and second substrates 200 and 400. The bonding member 300 couples the first and second substrates 200 and 400 with each other.

The first substrate 200 has a display area DA and a bonding area BA surrounding the display area DA. The display area DA includes a plurality of pixel areas PA, and pixels PXL are provided in the pixel areas PA. The bonding area BA represents an area in which the first substrate 200 is coupled to the second substrate 400. The first substrate 200 is coupled with the second substrate 400 by the bonding member 300 interposed between the first and second substrates 200 and 400 in the bonding area BA.

The first substrate 200 has a gate bonding area GBA and a data bonding area DBA. The organic light emitting display 500 further includes a gate driver electrically connected to the first substrate 200 in the gate bonding area GBA and a data driver electrically connected to the first substrate 200 in the data bonding area DBA. The gate driver and the data driver provide the first substrate 200 with data such that the organic light emitting display 500 displays images using the data.

FIG. 2 is a sectional view showing a part of an organic light emitting display according to an exemplary embodiment of the present invention.

Referring to FIG. 2, the first substrate 200 includes a base substrate 100, a switching transistor TR1, a driving transistor TR2, the pixel PXL including a first electrode 170 and an organic light emitting layer EL, an organic layer pattern 140, an insulating layer pattern 150, a bank pattern 160, and a second electrode 180.

The switching transistor TR1 is provided on the base substrate 100. The switching transistor TR1 includes a first gate electrode GE1, a first source electrode SE1, a first drain electrode DE1 and a first active pattern AP1. A gate line is provided on the base substrate 100 to transmit a gate signal. The first gate electrode GE1 branches from the gate line. A data line insulated from the gate line is provided on the gate line to transmit a data signal. The first source electrode SE1 branches from the data line.

The switching transistor TR1 is turned on in response to the gate signal provided from the gate line. When the switching transistor TR1 is turned on, the data signal is transmitted to the first drain electrode DE2 through the first source electrode SE1 and the first active pattern AP1.

The driving transistor TR2 includes a second gate electrode GE2, a second source electrode SE2, a second drain electrode DE2 and a second active pattern AP2. A power supply line is provided on the base substrate 100 to transmit a supply voltage. The second source electrode SE2 branches from the power supply line.

The second gate electrode GE2 is electrically connected to the first drain electrode DE1 by a first connection electrode BE1. When the switching transistor TR1 is turned on, the data signal is transmitted from the first drain electrode DE1 to the second gate electrode GE2 through the first connection electrode BE1, so that the driving transistor TR2 is turned on. The supply voltage is transmitted to the second drain electrode DE2 through the second source electrode SE2 and the second active pattern AP2.

The second drain electrode DE2 is electrically connected to a second connection electrode BE2 through a first contact hole CH1. The second connection electrode BE2 is electrically connected to the first electrode 170. As such, the second drain electrode DE2 is electrically connected to the first electrode 170. According to an exemplary embodiment, the first electrode 170 is electrically connected to the second drain electrode DE2 by the second connection electrode BE2. According to an exemplary embodiment, the first electrode 170 is directly and electrically connected to the second drain electrode DE2 through the first contact hole CH1 without the second connection electrode BE2.

A first insulating layer 110 is provided on the base substrate 100 to cover the second active pattern AP2, the second source electrode SE2 and the second drain electrode DE2. A second insulating layer 120 is provided on the first insulating layer 110 to cover the first gate electrode GE1. A third insulating layer 130 is provided on the second insulating layer 120 to cover the first source electrode SE1, the first drain electrode DE1 and the second gate electrode GE2.

The organic layer pattern 140 is provided on the switching transistor TR1 and the driving transistor TR2 to cover the switching transistor TR1 and the driving transistor TR2. The organic layer pattern 140 includes an organic photoresist material. The organic layer pattern 140 has thickness differences depending on positions. For example, the organic layer pattern 140 has a first thickness T1 in the pixel area PA and has a second thickness T2 smaller than the first thickness T1 in the bonding area BA.

The thickness of the organic layer pattern 140 in the bonding area BA is smaller than the thickness of the organic layer pattern 140 in the pixel area PA by as much as the thickness difference between the first thickness T1 and the second thickness T2. Accordingly, a uniform cell gap of the organic light emitting display 500 can be maintained.

The insulating layer pattern 150 includes silicon nitride. A first opening H1 is formed through the insulating layer pattern 150 corresponding to the pixel area PA. The insulating layer pattern 150 is provided on the organic layer pattern 140 to cover the organic layer pattern 140. Accordingly, the insulating layer pattern 150 prevents gas generated from the organic layer pattern 140 from penetrating into the organic light emitting layer EL. The insulating layer pattern 150 prevents a chemical interaction between the organic light emitting layer EL and the gas.

The bank pattern 160 is provided on the insulating layer pattern 150. The bank pattern 160 includes an organic photoresist material. A second opening H2 is formed through the bank pattern 160 corresponding to a position of the first opening H1. The bank pattern 160 of the bonding area BA is removed to form a third opening H3. The bonding member 300 contacts the insulating layer pattern 150 in the bonding area BA.

The pixel PXL includes the first electrode 170 and the organic light emitting layer EL provided on the first electrode 170. The first electrode 170 is electrically connected to the second connection electrode BE2 through the first contact hole CH1. Accordingly, when the driving transistor TR2 is turned on, the supply voltage is transmitted to the first electrode 170 through the second drain electrode DE2 and the second connection electrode BE2. The organic light emitting layer EL is accommodated in the first and second openings H1 and H2 such that a lower part of the organic light emitting layer EL contacts the first electrode 170.

The second electrode 180 is provided on the organic light emitting layer EL and the bank pattern 160. The organic light emitting layer EL interposed between the first electrode 170 and the second electrode 180 emits light due to a voltage difference between the first electrode 170 and the second electrode 180.

In an exemplary embodiment, the organic light emitting display 500 has a top-emission structure, where the light generated from the organic light emitting layer EL is emitted to the outside through the second substrate 400. Accordingly, the second electrode 180 may include a transparent conductive material such as, for example, indium tin oxide or indium zinc oxide, and the first electrode 170 may include metal, such as, for example, aluminum, to reflect the light. The organic light emitting display 500 according to an exemplary embodiment may have a bottom-emission structure. In the bottom-emission structure, light generated from the organic light emitting layer EL may be emitted to the outside through the first substrate 200. When the organic light emitting display 500 has the bottom-emission structure, the first electrode 170 may include a transparent conductive material and the second electrode 180 may include metal to reflect the light.

The second substrate 400 faces the first substrate 200. The second substrate 400 is coupled with the first substrate 200 in the bonding area BA by the bonding member 300 interposed between the first substrate 200 and the second substrate 400.

The third opening H3 is formed through the bank pattern 160 in the bonding area BA, so that the bonding member 300 contacts the insulating layer pattern 150 in the bonding area BA. The insulating layer pattern 150 includes, for example, silicon nitride. The bank pattern 160 includes, for example, an organic material. When the bonding member 300 is formed using a sealant including a polymer, the coupling force between the bonding member 300 and the insulating layer pattern 150 is greater than the coupling force between the bonding member 300 and the bank pattern 160. Accordingly, when the third opening H3 is formed through the bank pattern 160 to couple the bonding member 300 to the insulating layer pattern 150, the gas and moisture cannot be introduced from the outside to the organic light emitting display 500 through a gap between the bonding member 300 and the insulating layer pattern 150.

A data pad DP is provided on the base substrate 100 corresponding to the data bonding area DBA. A third connection electrode BE3 is provided on the data pad DP, and the third connection electrode BE3 is exposed to the outside through a second contact hole CH2. The third connection electrode BE3 is electrically connected to a pad of a flexible printed circuit board through the second contact hole CH2.

Figure 3:
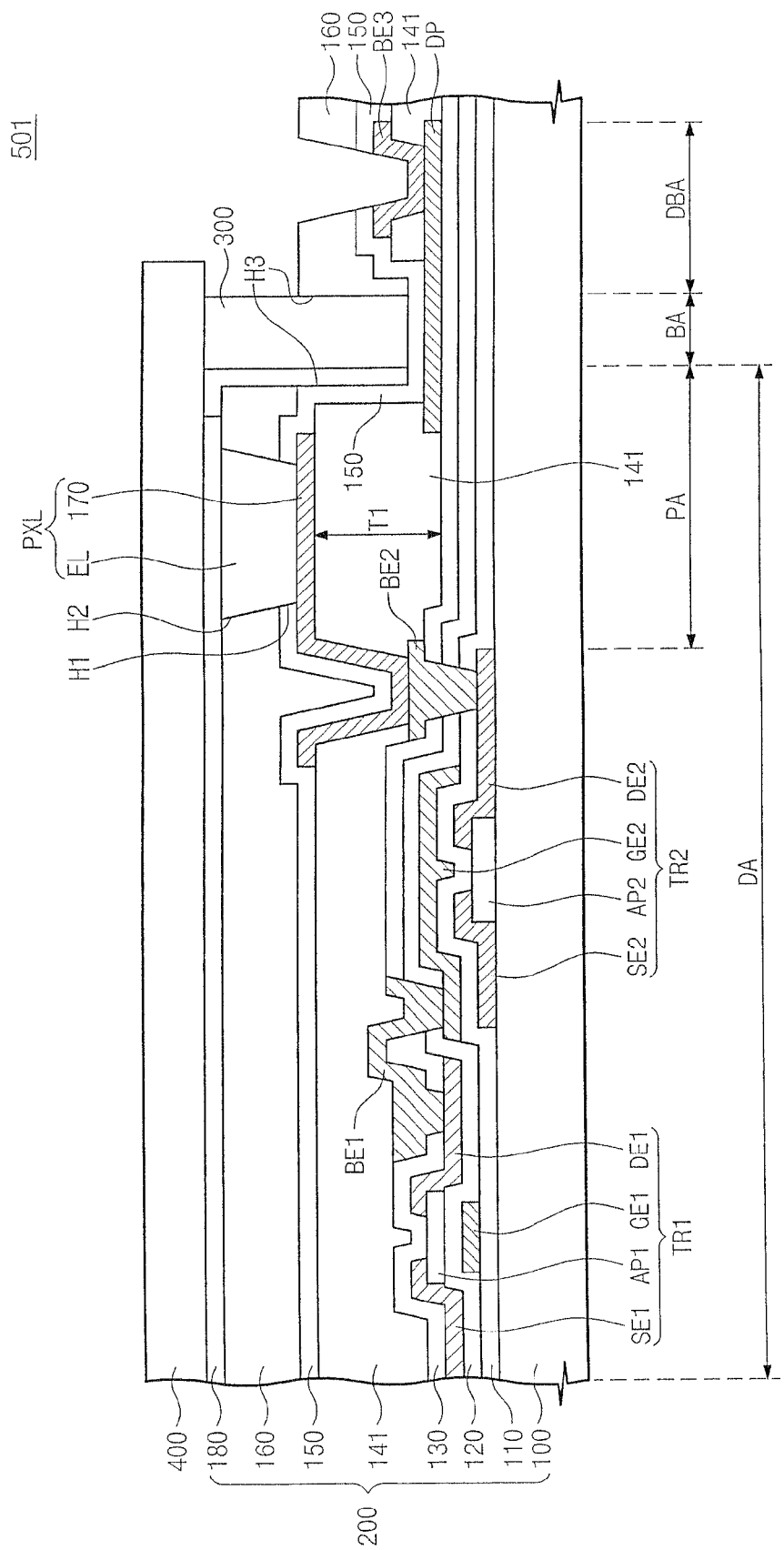
FIG. 3 is a sectional view showing an organic light emitting display according to an exemplary embodiment of the present invention.

FIG. 3 is a sectional view showing an organic light emitting display according to another exemplary embodiment of the present invention.

Referring to FIG. 3, the organic light emitting display 501 has an organic layer pattern 141 partially removed in the bonding area BA.

When the organic layer pattern 141 is completely removed in the bonding area BA, the moisture or gas cannot be introduced into the organic light emitting layer EL in the bonding area BA from the organic layer pattern 141. As a result, the light emission function of the organic light emitting layer EL may be prevented from being degraded due to the chemical reaction between the moisture or gas and the organic light emitting layer EL.

FIGS. 4 to 11 are sectional views showing a method of manufacturing an organic light emitting display according to an exemplary embodiment of the present invention.

Figure 4:
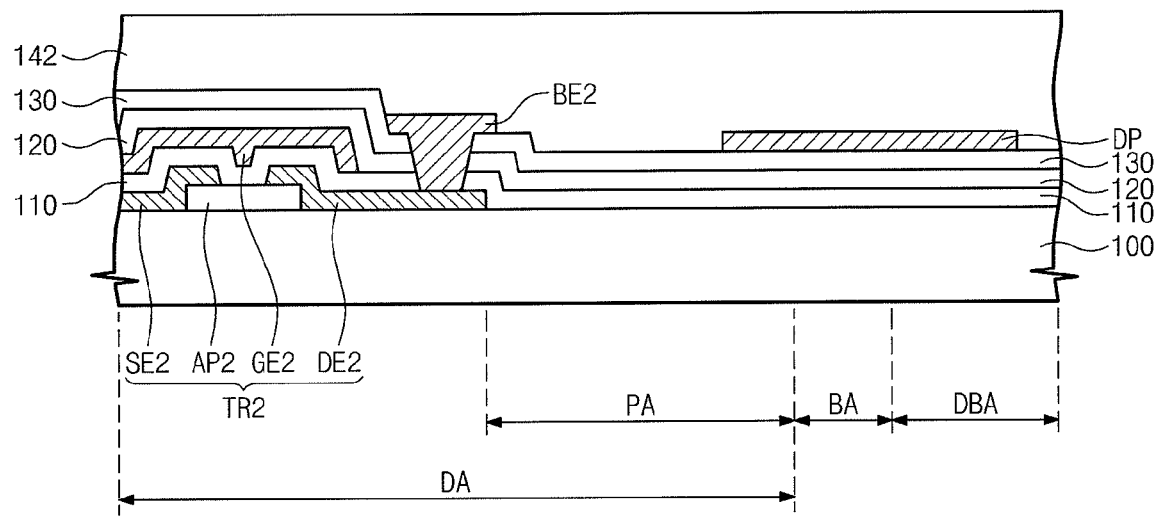
FIGS. 4 to 11 are sectional views showing a method of manufacturing an organic light emitting display according to an exemplary embodiment of the present invention.
Figure 5:
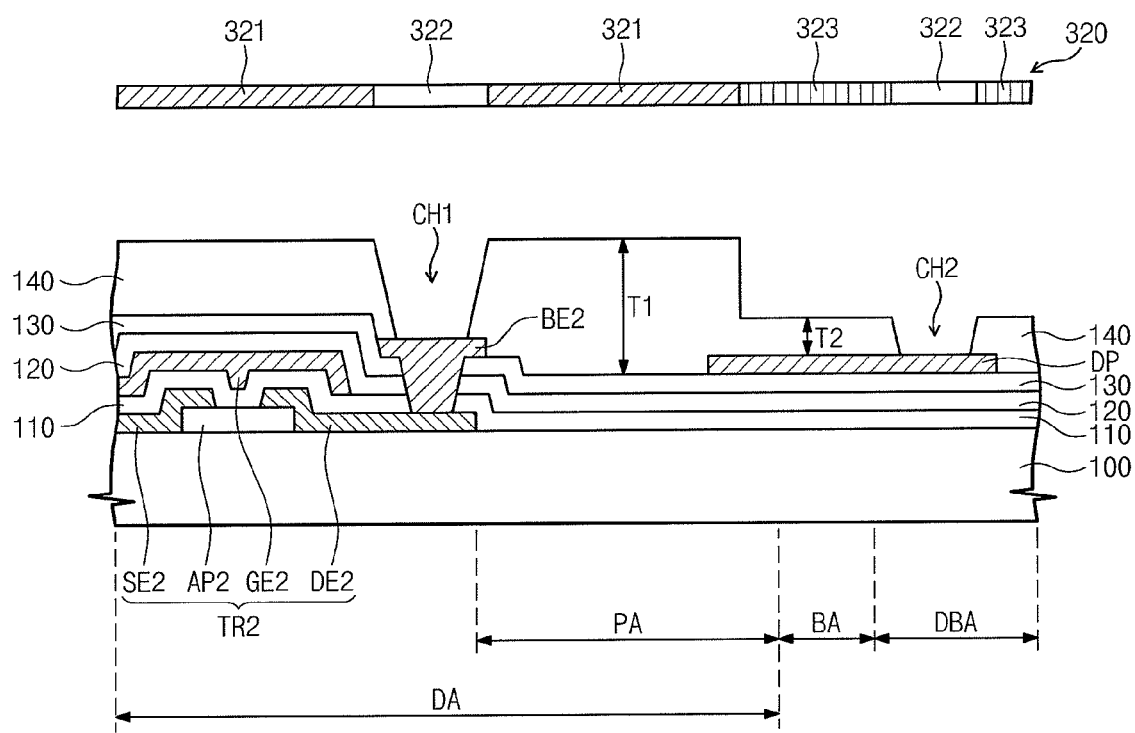

Referring to FIGS. 4 and 5, the driving transistor TR2 is formed on the base substrate 100, and the second connection electrode BE2 is electrically connected to the second drain electrode DE2 of the driving transistor TR2.

After the driving transistor TR2 and the second connection electrode BE2 are formed on the base substrate 100, an organic layer 142 including a photoresist material is formed on the base substrate 100. After the organic layer 142 is formed, the organic layer 142 is patterned through the exposure and development process using a first slit mask 320.

The first slit mask 320 includes a light blocking part 321, a light transmitting part 322 and a transflective part 323. The light blocking part 321 blocks light, and the light transmitting part 322 passes through the light. The transflective part 323 partially transmits light such that less light passes therethrough as compared with the light transmitting part 322. The light is projected from the upper part of the first slit mask 320. The light passing through the first slit mask 320 is transferred to the organic layer 142. Then the organic layer 142 is developed. Accordingly, the organic layer pattern 140 having a position variable thickness is formed.

The organic layer pattern 140 is completely removed from the first contact hole CH1, so that the second connection electrode BE2 is exposed to the outside. The organic layer pattern 140 is completely removed on the second contact hole CH2, so that the data pad DP is exposed to the outside. The organic layer pattern 140 has the first thickness T1 in the display area DA except for an area having the first contact hole CH1. The organic layer pattern 140 has the second thickness T2, which is smaller than the first thickness T1, in the bonding area BA.

Figure 6:
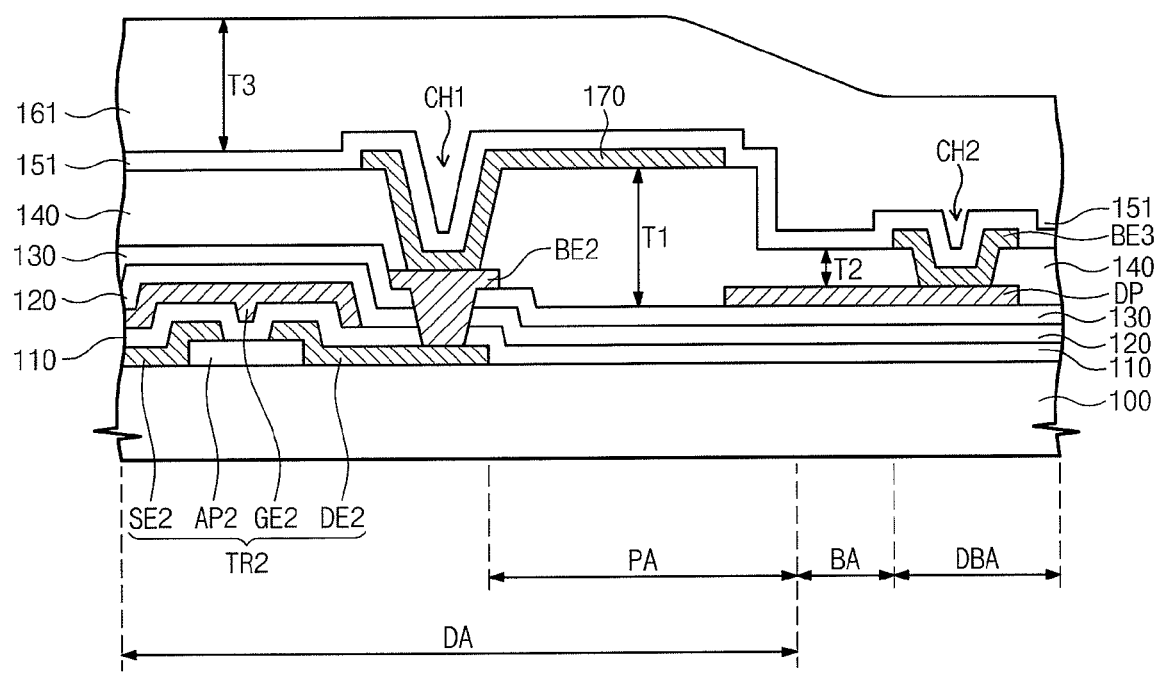
Figure 7:
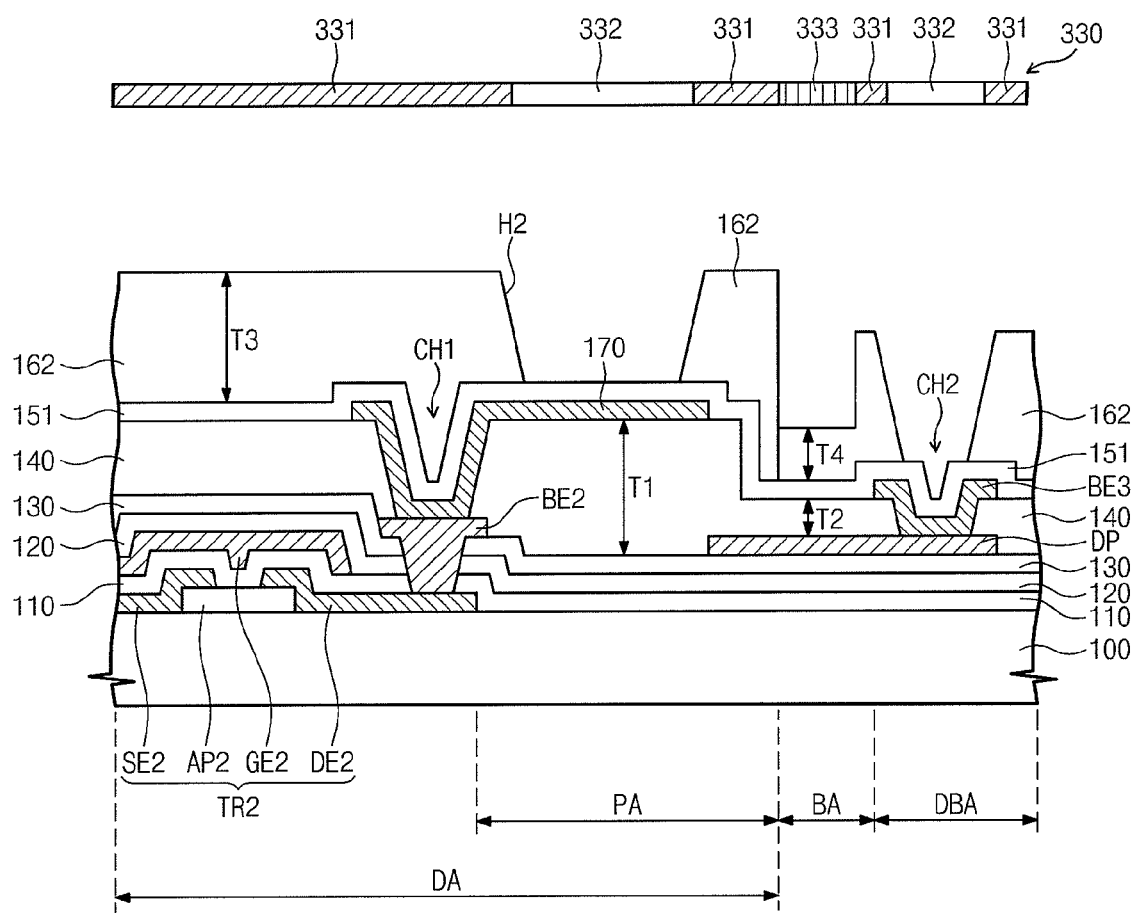

Referring to FIGS. 6 and 7, after the organic layer pattern 140 is formed, the first electrode 170 is electrically connected to the second connection electrode BE2 through the second contact hole CH2. After the first electrode 170 is formed, a preliminary insulating layer 151 covering the first electrode 170 is formed on the organic layer pattern 140.

The preliminary insulating layer 151 is formed by depositing an insulating material on the first base substrate 100 having the first electrode 170. After the preliminary insulating layer 151 is formed, a preliminary bank layer 161 is formed on the preliminary insulating layer 151. The preliminary bank layer 161 is formed by depositing a bank material such as, for example, a photoresist on the preliminary insulating layer 151. The preliminary bank layer 161 is formed on the preliminary insulating layer 151 in a third thickness T3.

After the preliminary bank layer 161 is formed, the preliminary bank layer 161 is patterned through the exposure and development process using a second slit mask 330. The second slit mask 330 includes a light blocking part 331, a light transmitting part 332 and a transflective part 333. The light blocking part 331 is aligned corresponding to the display area DA except for an area having the second opening H2 and corresponding to the data bonding area DBA except for an area having the second contact hole CH2. The light transmitting part 332 is aligned corresponding to an area through which the pixel area PA and the data pad DP are exposed to the outside. The transflective part 333 is aligned corresponding to the bonding area BA.

The second slit mask 330 is disposed on the preliminary bank layer 161. Light is projected from the upper part of the second slit mask 330 such that the light passes through the second slit mask 330 and then is transferred to the preliminary bank layer 161. Then, the preliminary bank layer 161 is subject to an exposure and development process to form a preliminary bank pattern 162. The preliminary bank pattern 162 has the second opening H2 corresponding to the pixel area PA, and is opened corresponding to a position of the second contact hole CH2.

The preliminary bank pattern 162 has a position variable thickness. For example, the preliminary bank pattern 162 has the third thickness T3 corresponding to the display area DA except for an area having the second opening H2, and has a fourth thickness T4, which is smaller than the third thickness T3, in the bonding area BA.

Figure 8:
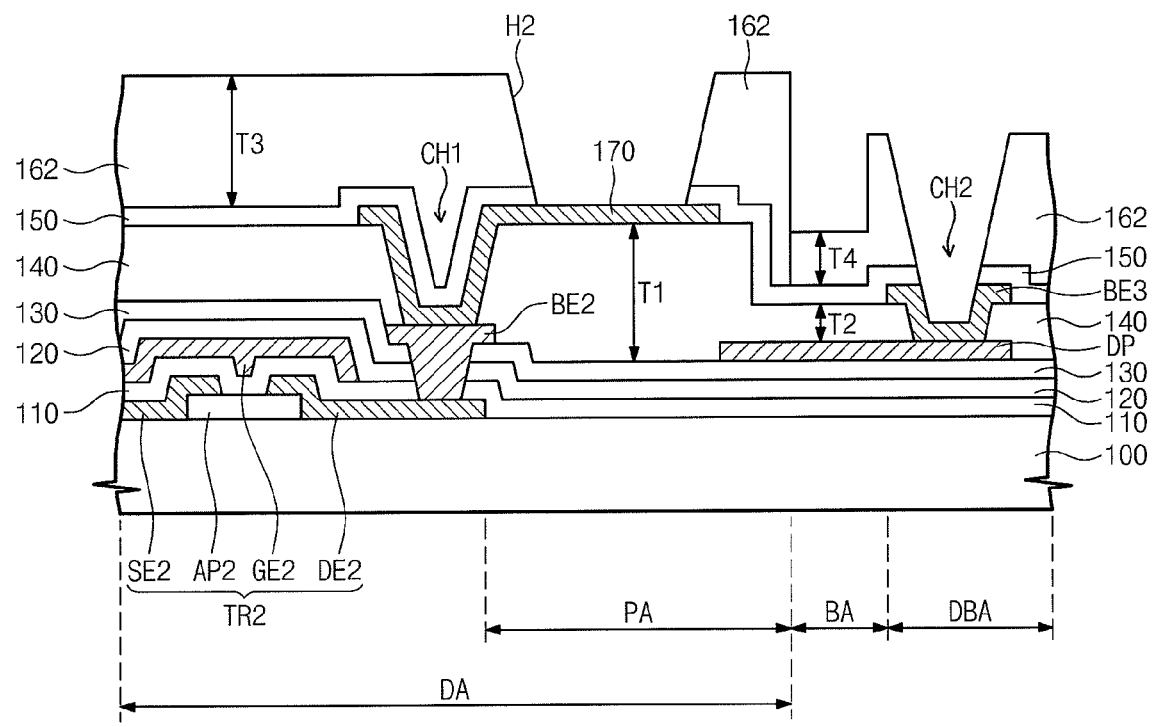
Figure 9:
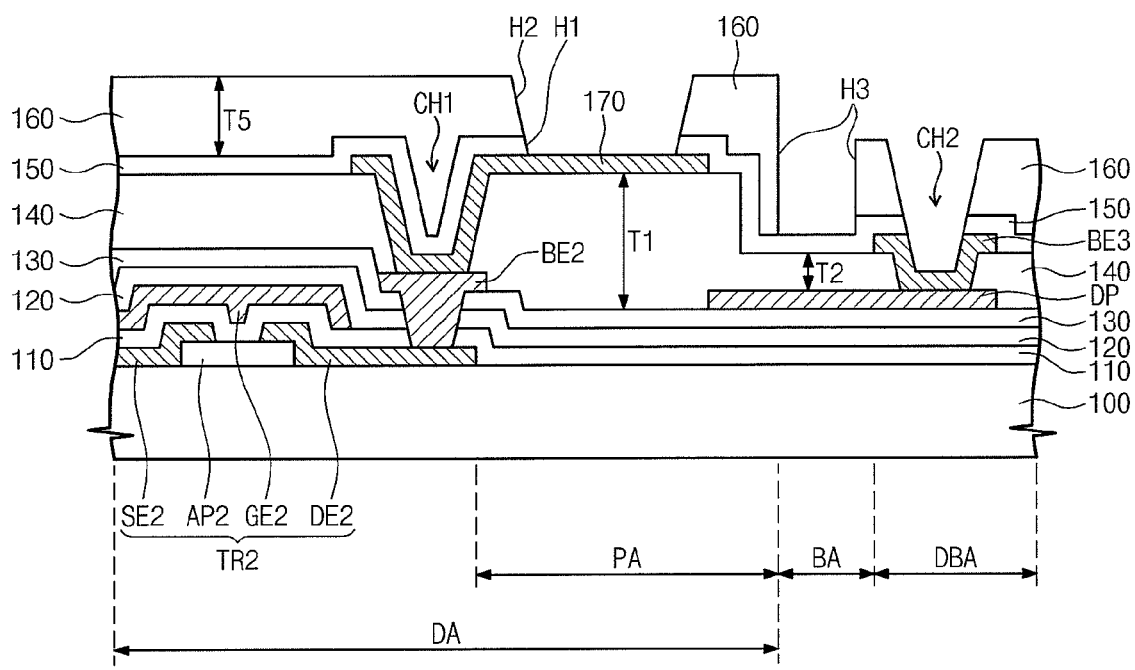

Referring to FIGS. 8 and 9, after the preliminary bank pattern 162 is formed, the preliminary insulating layer 151 is patterned using the preliminary bank pattern 162 as a mask, thereby forming the insulating layer pattern 150. The insulating layer pattern 150 has the first opening H1 corresponding to the pixel area PA, so that the first electrode 170 is exposed to the outside. The insulating layer pattern 150 is removed corresponding to the second contact hole CH2, so that the data pad DP is exposed to the outside.

After the insulating layer pattern 150 is formed, the preliminary bank pattern 162 is removed by the fourth thickness T4, thereby forming the bank pattern 160. The bank pattern 160 on the bonding area BA is completely removed, so that the third opening H3 is formed through the bank pattern 160. The bank pattern 160 has a fifth thickness corresponding to a thickness difference between the third thickness T3 and the fourth thickness T4.

Figure 10:
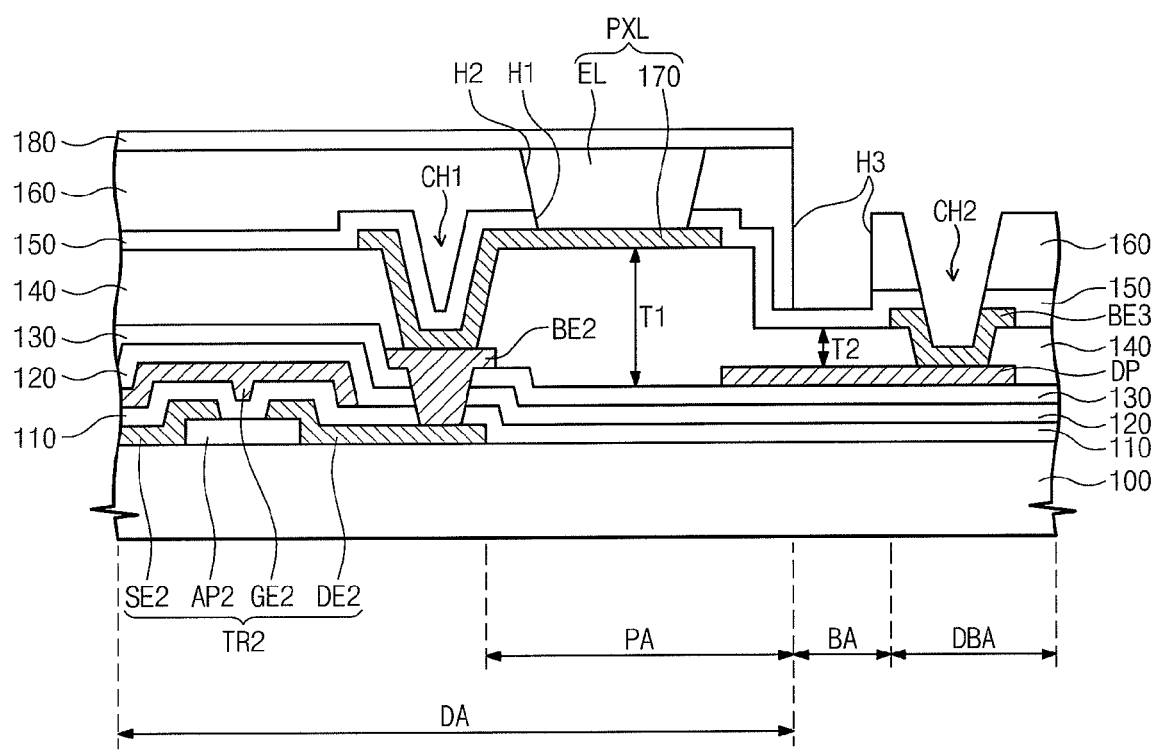
Figure 11:
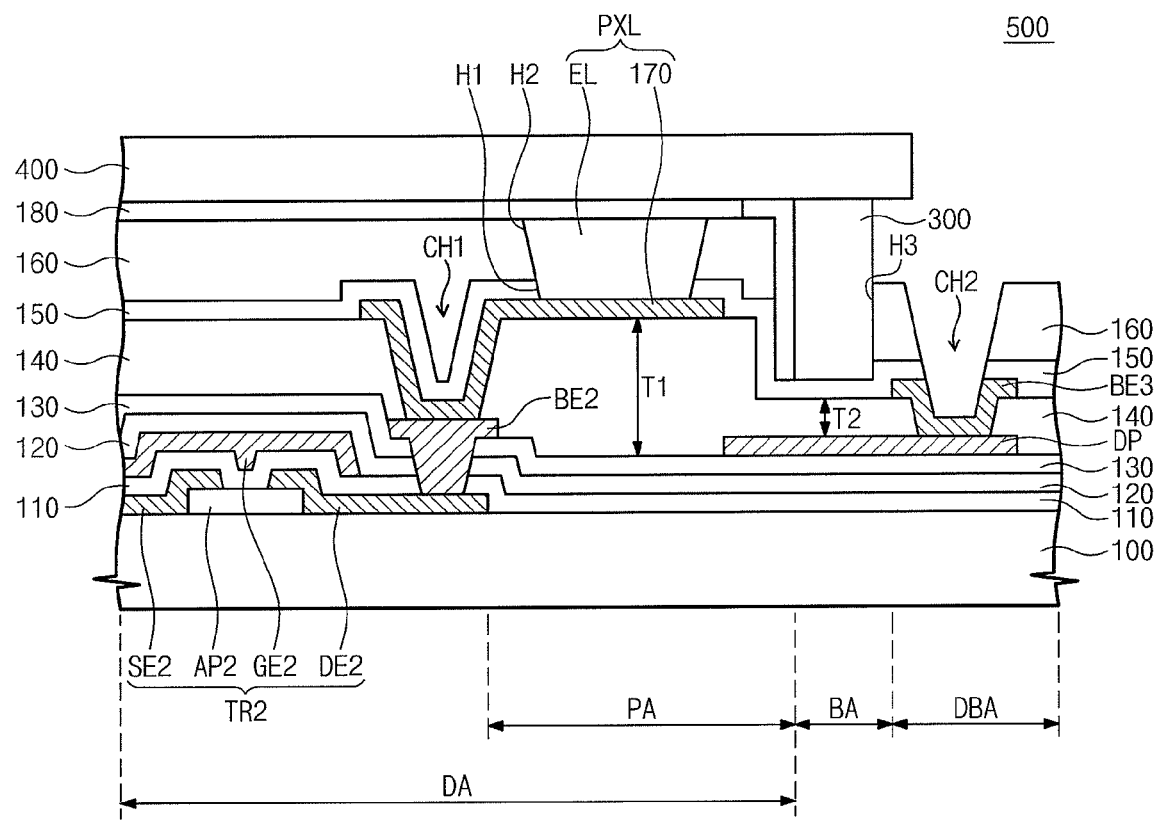

Referring to FIGS. 10 and 11, the organic light emitting layer EL is filled in the first opening H1 and the second opening H2. The second electrode 180 is formed on the organic light emitting layer EL and the bank pattern 160.

After the second electrode 180 is formed, the bonding member 300 is formed between the first substrate 200 and the second substrate 400 corresponding to the bonding area BA. Then the first substrate 200 is coupled to the second substrate 400 using the bonding member 300.

Figure 12:
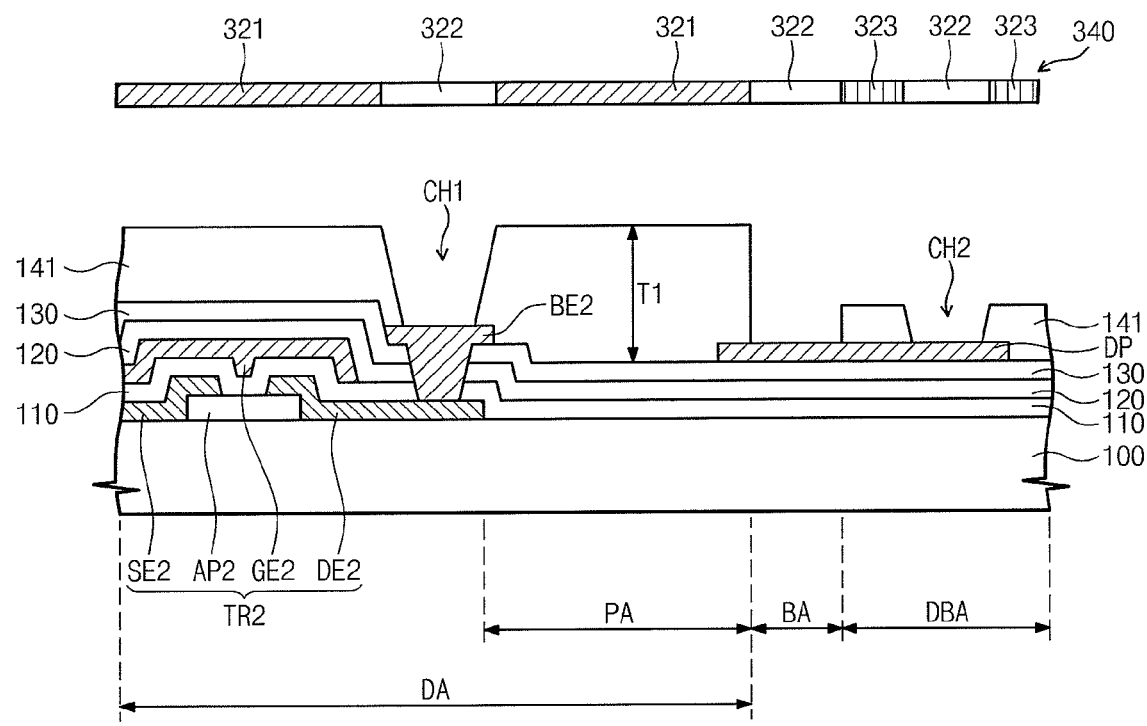
FIG. 12 is a sectional view showing a method of manufacturing an organic light emitting display according to an exemplary embodiment of the present invention.

FIG. 12 is a sectional view showing a method of manufacturing an organic light emitting display according to an exemplary embodiment of the present invention.

Referring to FIGS. 4 and 12, the organic layer 142 including photoresist is formed on the entire surface of the base substrate 100, and the organic layer 142 is patterned through the exposure and development process using a third slit mask 340.

The third slit mask 340 includes a light blocking part 321, a light transmitting part 322, and a transflective part 323. The light blocking part 331 is aligned corresponding to the display area DA except for an area having the first contact hole CH1. The light transmitting part 322 is aligned corresponding to the area having the first contact hole CH1. The light transmitting part 322 is also aligned along the bonding area BA and an area through which the data pad DP is exposed to the outside. The transflective part 323 is aligned corresponding to the data bonding area DBA except for an area through which the data pad DP is exposed to the outside.

The third slit mask 340 is aligned at an upper part of the organic layer 142. Then light is projected from the upper part of the third slit mask 340 such that the light passing through the third slit mask 340 is transferred to the organic layer 142. Then, the organic layer 142 is subject to the exposure and development process, thereby forming the organic layer pattern 141 having a position variable thickness.

The organic layer pattern 141 is completely removed from the first contact hole CH1, so that the second connection electrode BE2 is exposed to the outside. The organic layer pattern 141 is removed from the second contact hole CH2, so the data pad DP is exposed to the outside. The organic layer pattern 141 is completely removed from the bonding area BA.

The organic layer pattern 141 is completely removed from the bonding area BA. As such, the moisture or gas cannot be introduced to the organic light emitting layer EL from the organic layer pattern 141 that is disposed corresponding to the bonding area BA.

The insulating layer pattern 150 is provided on the organic layer pattern 141 to cover the organic layer pattern 141. The insulating layer pattern 150 prevents the gas generated from the organic layer pattern 141 from penetrating into the organic light emitting layer EL.

To form the bank pattern defining the area where the organic light emitting layer is formed, the preliminary bank pattern is formed by developing the bank layer and then the preliminary bank pattern is subject to the etch back process. The insulating layer pattern formed at the lower part of the bank pattern is patterned using the preliminary bank pattern as a mask. Accordingly, when the organic light emitting display is manufactured, a photolithography process used to form the insulating layer pattern can be omitted according to an exemplary embodiment of the present invention.

Although exemplary embodiments have been described with reference to the accompanying drawings, it is to be understood that the present invention is not limited to these precise embodiments but various changes and modifications can be made by one skilled in the art without departing from the spirit and scope of the present invention. All such changes and modifications are intended to be included within the scope of the invention as defined by the appended claims.

What is claimed is:

1. An organic light emitting display comprising:
    a first substrate having a plurality of pixel areas;
    a driving transistor disposed on the first substrate;
    an organic layer disposed on the driving transistor;
    a first electrode disposed on the organic layer and electrically connected to the driving transistor;
    an insulating layer pattern disposed on the organic layer, the insulating layer pattern having a first opening corresponding to each pixel area;
    a bank pattern disposed on the insulating layer pattern, the bank pattern having a second opening corresponding to the first opening;
    an organic light emitting layer disposed in the first and second openings; and
    a second electrode disposed on the organic light emitting layer,
    wherein the first substrate comprises a bonding area surrounding the pixel areas, and a third opening is formed through the bank pattern corresponding to the bonding area.

2. The organic light emitting display of claim 1, further comprising:
    a second substrate facing the first substrate; and
    a bonding member disposed between the first substrate and the second substrate to couple the first substrate to the second substrate.

3. The organic light emitting display of claim 2, wherein the bonding member contacts the insulating layer pattern in the bonding area through the third opening.

4. The organic light emitting display of claim 3, wherein the insulating layer pattern comprises silicon nitride.

5. The organic light emitting display of claim 1, wherein the bank pattern comprises a photoresist material.

6. The organic light emitting display of claim 1, wherein the organic layer is removed from the bonding area.

7. The organic light emitting display of claim 1, wherein the insulating layer pattern prevents gas or moisture generated from the organic layer from penetrating into the organic light emitting layer.

* * * * *